(12) United States Patent
Pratt

(10) Patent No.: US 9,054,165 B2
(45) Date of Patent: Jun. 9, 2015

(54) SEMICONDUCTOR DEVICES INCLUDING A THROUGH-SUBSTRATE CONDUCTIVE MEMBER WITH AN EXPOSED END

(75) Inventor: David S. Pratt, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/468,655

(22) Filed: May 10, 2012

(65) Prior Publication Data

US 2012/0217652 A1    Aug. 30, 2012

Related U.S. Application Data

(62) Division of application No. 11/831,247, filed on Jul. 31, 2007, now Pat. No. 8,193,092.

(51) Int. Cl.
*H01L 23/48* (2006.01)
*H01L 23/52* (2006.01)
(Continued)

(52) U.S. Cl.
CPC .......... *H01L 21/76898* (2013.01); *H01L 24/02* (2013.01); *H01L 24/16* (2013.01); *H01L 24/97* (2013.01); *H01L 25/0657* (2013.01); *H01L 25/50* (2013.01); *H01L 2224/13025* (2013.01); *H01L 2225/06513* (2013.01); *H01L 2225/06541* (2013.01); *H01L 2924/01082* (2013.01); *H01L 2924/14* (2013.01); *H01L 2924/01005* (2013.01);
(Continued)

(58) Field of Classification Search
CPC .............. H01L 2924/01079; H01L 2924/14; H01L 2924/01029; H01L 2924/01078; H01L 2224/48091

USPC ......... 257/433, 686, 296, 303, 690, 734, 773, 257/774; 438/667, 584, 597, 666
See application file for complete search history.

(56) References Cited

U.S. PATENT DOCUMENTS 3,822,235 A      7/1974  Hunter et al.
4,980,034 A  *  12/1990  Volfson et al. ................ 205/122
(Continued)

FOREIGN PATENT DOCUMENTS

EP      1538663 A2     6/2005
JP      2006173637 A   6/2006
WO      2005038905 A1  4/2005

OTHER PUBLICATIONS

Jindal, A. et al., "Wafer Thinning for Monolithic 3D Integration," Mat. Res. Soc. Symp. Proc. vol. 766, pp. E5.7.1-E5.7.6, Materials Research Society, 2003.
(Continued)

*Primary Examiner* — Thao X Le
*Assistant Examiner* — Eric Jones
(74) *Attorney, Agent, or Firm* — Perkins Coie LLP

(57) ABSTRACT

Semiconductor devices and methods of manufacturing semiconductor devices. One example of a method of fabricating a semiconductor device comprises forming a conductive feature extending through a semiconductor substrate such that the conductive feature has a first end and a second end opposite the first end, and wherein the second end projects outwardly from a surface of the substrate. The method can further include forming a dielectric layer over the surface of the substrate and the second end of the conductive feature such that the dielectric layer has an original thickness. The method can also include removing a portion of the dielectric layer to an intermediate depth less than the original thickness such that at least a portion of the second end of the conductive feature is exposed.

11 Claims, 13 Drawing Sheets

(51) Int. Cl.
*H01L 29/40* (2006.01)
*H01L 21/768* (2006.01)
*H01L 25/065* (2006.01)
*H01L 25/00* (2006.01)
*H01L 23/00* (2006.01)

(52) U.S. Cl.
CPC ............ *H01L 2924/01006* (2013.01); *H01L 2924/01033* (2013.01); *H01L 2924/014* (2013.01); *H01L 2224/05009* (2013.01); *H01L 2224/0557* (2013.01); *H01L 2224/05571* (2013.01); *H01L 2224/16146* (2013.01); *H01L 2224/05572* (2013.01)

(56) References Cited

U.S. PATENT DOCUMENTS

| | | | |
|---|---|---|---|
| 5,106,461 A * | 4/1992 | Volfson et al. | 205/125 |
| 5,528,080 A * | 6/1996 | Goldstein | 257/741 |
| 5,792,596 A | 8/1998 | Yasuzato et al. | |
| 6,239,495 B1 | 5/2001 | Sakui et al. | |
| 6,242,931 B1 | 6/2001 | Hembree et al. | |
| 6,429,509 B1 * | 8/2002 | Hsuan | 257/690 |
| 6,608,371 B2 | 8/2003 | Kurashima et al. | |
| 6,610,597 B2 | 8/2003 | Kobayashi | |
| 6,753,129 B2 | 6/2004 | Livesay et al. | |
| 6,869,899 B2 | 3/2005 | Mahorowala et al. | |
| 6,900,001 B2 | 5/2005 | Livesay et al. | |
| 6,930,382 B2 | 8/2005 | Sawada et al. | |
| 6,930,395 B2 | 8/2005 | Tomekawa et al. | |
| 7,045,893 B1 | 5/2006 | Paek et al. | |
| 7,060,526 B2 | 6/2006 | Farnworth et al. | |
| 7,118,989 B2 | 10/2006 | Ramanathan et al. | |
| 7,141,493 B2 | 11/2006 | Masuda | |
| 7,211,899 B2 | 5/2007 | Taniguchi et al. | |
| 7,326,629 B2 | 2/2008 | Nagarajan et al. | |
| 7,361,532 B2 | 4/2008 | Fukazawa | |
| 7,425,499 B2 | 9/2008 | Oliver et al. | |
| 7,646,086 B2 | 1/2010 | Egawa | |
| 2002/0046880 A1 | 4/2002 | Takubo et al. | |
| 2003/0082845 A1 | 5/2003 | Hoffman et al. | |
| 2003/0108818 A1 | 6/2003 | Livesay et al. | |
| 2003/0232486 A1 | 12/2003 | Mashino | |
| 2004/0043603 A1 | 3/2004 | Wood et al. | |
| 2004/0112633 A1 | 6/2004 | Endo et al. | |
| 2004/0152024 A1 | 8/2004 | Livesay et al. | |
| 2004/0227225 A1 | 11/2004 | Fjelstad et al. | |
| 2004/0229398 A1 | 11/2004 | Magerlein et al. | |
| 2004/0245623 A1 | 12/2004 | Hara et al. | |
| 2004/0259325 A1 | 12/2004 | Gan | |
| 2005/0014311 A1 | 1/2005 | Hayasaka et al. | |
| 2005/0016764 A1 | 1/2005 | Echigo et al. | |
| 2005/0017338 A1 * | 1/2005 | Fukazawa | 257/686 |
| 2005/0046038 A1 | 3/2005 | Farnworth | |
| 2005/0134768 A1 | 6/2005 | Sugiura et al. | |
| 2005/0173532 A1 | 8/2005 | Hasebe et al. | |
| 2005/0186705 A1 | 8/2005 | Jackson et al. | |
| 2005/0236709 A1 | 10/2005 | Eng et al. | |
| 2005/0275049 A1 * | 12/2005 | Kirby et al. | 257/433 |
| 2006/0019482 A1 | 1/2006 | Su et al. | |
| 2006/0043477 A1 | 3/2006 | Akram | |
| 2006/0046468 A1 * | 3/2006 | Akram et al. | 438/637 |
| 2006/0113682 A1 | 6/2006 | Farnworth | |
| 2006/0131729 A1 | 6/2006 | Lee | |
| 2006/0168552 A1 | 7/2006 | Farnworth et al. | |
| 2006/0222998 A1 | 10/2006 | Sato | |
| 2006/0228825 A1 | 10/2006 | Hembree | |
| 2006/0270108 A1 | 11/2006 | Farnworth et al. | |
| 2006/0290002 A1 | 12/2006 | Arana et al. | |
| 2007/0032059 A1 | 2/2007 | Hedler et al. | |
| 2007/0032085 A1 | 2/2007 | Lee et al. | |
| 2007/0048994 A1 | 3/2007 | Tuttle | |
| 2007/0090156 A1 | 4/2007 | Ramanathan | |
| 2007/0117348 A1 | 5/2007 | Ramanathan et al. | |
| 2008/0153187 A1 | 6/2008 | Luo et al. | |
| 2008/0277776 A1 | 11/2008 | Enomoto | |
| 2009/0001598 A1 | 1/2009 | Chiou et al. | |
| 2009/0032960 A1 | 2/2009 | Pratt | |
| 2009/0148616 A1 | 6/2009 | Itami et al. | |
| 2009/0160030 A1 | 6/2009 | Tuttle | |
| 2009/0189238 A1 | 7/2009 | Kirby et al. | |
| 2009/0191701 A1 | 7/2009 | Kirby et al. | |
| 2009/0261466 A1 | 10/2009 | Pagaila et al. | |
| 2010/0035382 A1 | 2/2010 | Fjelstad et al. | |
| 2011/0089539 A1 | 4/2011 | Akram et al. | |

OTHER PUBLICATIONS

Knickerbocker, J.U. et al., "Development of next-generation system-on-package (SOP) technology based on silicon carriers with fine-pitch chip interconnection," IBM J. Res. & Dev., vol. 49, No. 4/5, pp. 725-753, Jul./Sep. 2005.

\* cited by examiner

SEMICONDUCTOR DEVICES INCLUDING A THROUGH-SUBSTRATE CONDUCTIVE MEMBER WITH AN EXPOSED END

CROSS-REFERENCE TO RELATED APPLICATION

This application is a divisional of U.S. application Ser. No. 11/831,247 filed Jul. 31, 2007, now U.S. Pat. No. 8,193,092, which is incorporated herein by reference in its entirety.

TECHNICAL FIELD

The present invention is related to semiconductor devices and methods for manufacturing semiconductor devices suitable for stacked die packages and other applications.

BACKGROUND

Semiconductor devices are typically manufactured on semiconductor wafers or other types of workpieces using sophisticated equipment and processes that enable reliable, high-quality manufacturing. The individual dies (e.g., devices) generally include integrated circuits and a plurality of bond-pads coupled to the integrated circuits. The bond-pads provide external contacts through which supply voltage, electrical signals, and other input/output parameters are transmitted to/from the integrated circuits. The bond-pads are usually very small, and they are typically arranged in dense arrays having a fine pitch between bond-pads. The wafers and dies can also be quite delicate. As a result, the dies are packaged for protection and to provide terminals that can be reliably connected to printed circuit boards.

Semiconductor device manufacturers are developing more sophisticated devices in smaller sizes that have increasingly dense arrays of input/output terminals within decreasing "footprints" on printed circuit boards (i.e., the height and surface area that the device occupies on a printed circuit board). One technique to increase the density of microelectronic devices within a given footprint is to stack one microelectronic die on top of another. To fabricate stacked-die packages, the upper and lower dies are electrically coupled to each other and/or a lead frame or interposer substrate. In some applications, it may be desirable to form interconnects that extend completely through the dies or through a significant portion of the dies. Such interconnects can electrically couple bond-pads or other conductive elements at a front side of the dies to conductive elements at the back side of the dies. Through-substrate interconnects, for example, are constructed by forming deep vias at the front side of the workpiece in alignment with corresponding bond-pads. The vias are often blind vias in that they are closed at one end within the workpiece. The blind vias are then lined with a dielectric material and filled with a conductive fill material. The workpiece is thinned from the back side to expose the interconnects and reduce the thickness of the final dies. Solder balls or other external electrical connectors are subsequently attached to the through-substrate interconnects at the back side and/or the front side of the workpiece. The external connectors can be attached to the interconnects either before or after singulating the dies from the workpiece.

Conventional processes for forming external connectors on through-substrate interconnects at the back side of the workpiece include (a) depositing a dielectric layer on the back side of the workpiece, (b) forming a photo-resist layer on the dielectric layer, (c) patterning and developing the photo-resist layer, (d) etching completely through the dielectric layer to form holes aligned with corresponding interconnects, (e) removing the photo-resist layer from the workpiece, and (f) forming external connectors on the interconnects located in the holes in the dielectric layer. One concern with forming external connectors on the back side of a workpiece is that conventional processes are relatively expensive because patterning the photo-resist layer requires expensive and time-consuming photolithography equipment and processes to achieve the tolerances required in semiconductor devices.

DETAILED DESCRIPTION

Specific details of several embodiments are described below with reference to semiconductor devices and methods for fabricating semiconductor devices. The semiconductor devices are manufactured on and/or in semiconductor wafers that can include substrates upon which and/or in which microelectronic devices, micromechanical devices, data storage elements, optics, read/write components, and other features are fabricated. For example, SRAM, DRAM (e.g., DDR/SDRAM), flash memory (e.g., NAND flash-memory), processors, imagers, and other types of devices can be constructed on semiconductor wafers. Although many of the embodiments are described below with respect to semiconductor devices that have integrated circuits, other embodiments can have other types of devices manufactured on other types of substrates. Moreover, several other embodiments can have different configurations, different components, or additional features or procedures than those described in this section. Still other embodiments may not have several of the features shown and described below with reference to FIGS. 1-10.

Figure 1:
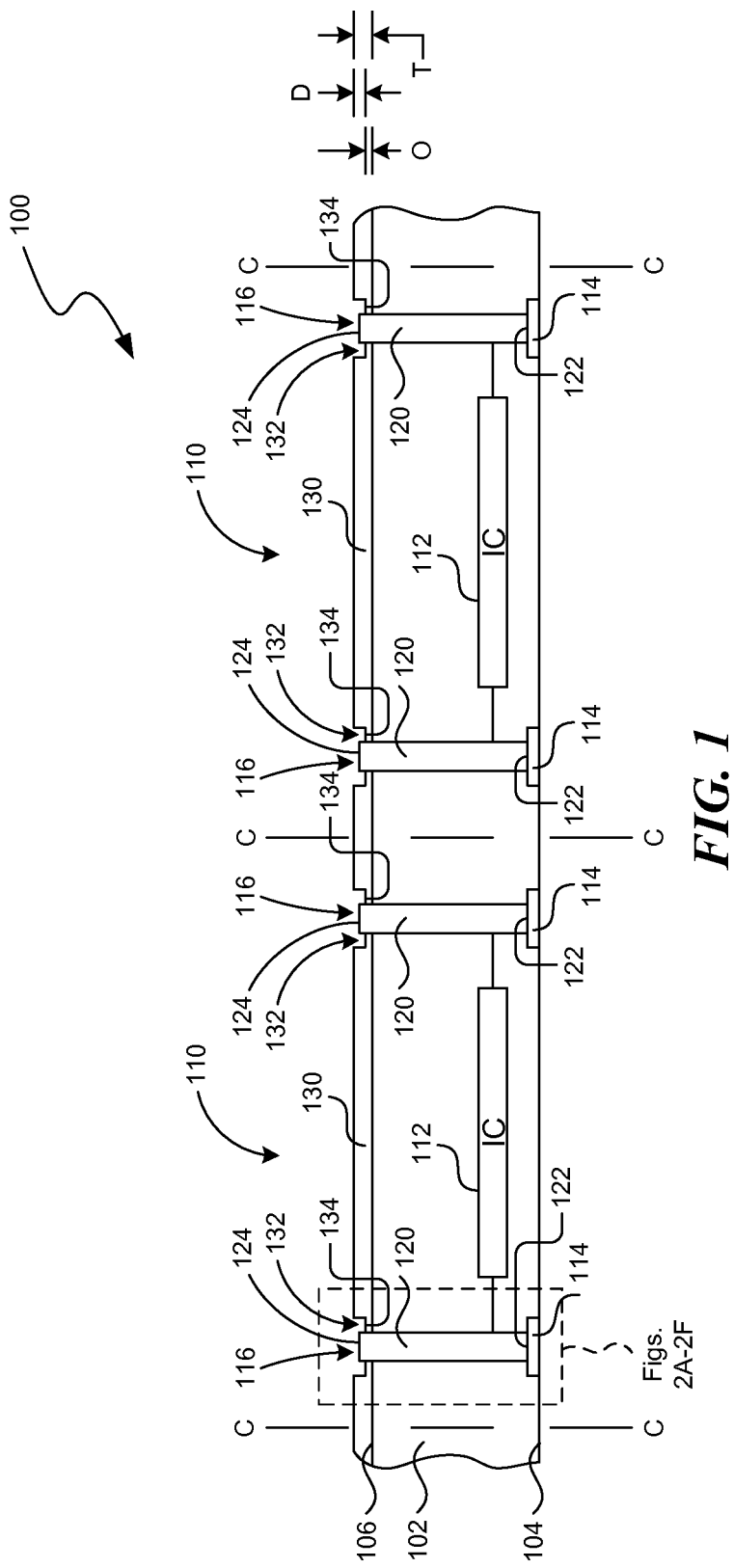
FIG. 1 is a schematic cross-sectional view of a portion of a semiconductor wafer with semiconductor devices in accordance with an embodiment of the technology.

FIG. 1 is a schematic cross-sectional view illustrating a portion of an embodiment of a semiconductor wafer 100. In this embodiment, the semiconductor wafer 100 includes a semiconductor substrate 102 having a first surface 104 and a second surface 106. The semiconductor substrate 102 can be formed from silicon, gallium arsenide, or other suitable semiconductive materials. The wafer 100 also includes a plurality of semiconductor dies 110 (e.g., devices) formed on and/or in the semiconductor substrate 102. The dies 110 are arranged in a die pattern across the semiconductor substrate 102 such that the dies 110 are spaced apart by cutting lanes C-C. For purposes of illustration, only two dies 110 are illustrated in FIG. 1, but in practice a large number of dies (e.g., 50-250) are formed on a single semiconductor substrate. Individual dies 110 include integrated circuitry 112, a plurality of first external contact sites 114 at the first surface 104 of the substrate 102, and a plurality of second external contact sites 116 at least proximate to the second surface 106 of the substrate 102. The dies 110 can further include a plurality of conductive features 120 electrically coupled to the integrated circuitry 112, the first external contact sites 114, and the second external contact sites 116.

The particular embodiment of the conductive features 120 illustrated in FIG. 1 are through-substrate interconnects. In this embodiment, the conductive features 120 have first ends 122 at the first external contact sites 114 and second ends 124 defining the second external contact sites 116. The second ends 124 of the conductive features 120 can be offset from the second surface 106 of the substrate 102. For example, the second ends 124 of the conductive features 120 can project outwardly or otherwise away from the second surface 106 of the substrate such that the tips of the second ends 124 are spaced apart from the second surface 106 by an offset distance O.

The semiconductor wafer 100 can further include a dielectric layer 130 at the second surface 106 of the substrate 102. The dielectric layer 130 can be composed of a polymeric material or another suitable dielectric material for protecting the second surface 106 of the substrate 102. The dielectric layer 130, for example, can be composed of a photo-imageable polymer, such as a photo-imageable polyimide. The dielectric layer 130 has a plurality of depressions 132 at the second external contact sites 116. The depressions extend to a depth D at an intermediate level within the dielectric layer 130 such that at least the tips of the second ends 124 of the conductive features 120 are exposed within the depressions 132. In many applications, the depressions 132 have bottom surfaces 134 at the intermediate depth D such that the bottom surfaces 134 are below the tips of the second ends 124 of the conductive features 120 but above the second surface 106 of the substrate 102. The depth that the depressions 132 extend into the dielectric layer 130 is accordingly less than the total thickness T of the dielectric layer 130 such that a portion of the dielectric layer 130 remains on the second surface 106 of the substrate 102 at the depressions 132. As such, the portions of the second surface 106 aligned with the depressions 132 and adjacent to the conductive features 120 are not exposed within the depressions 132, but at least a portion of the second ends 124 of the conductive features 120 are exposed within the depressions 132.

Figure 2A:
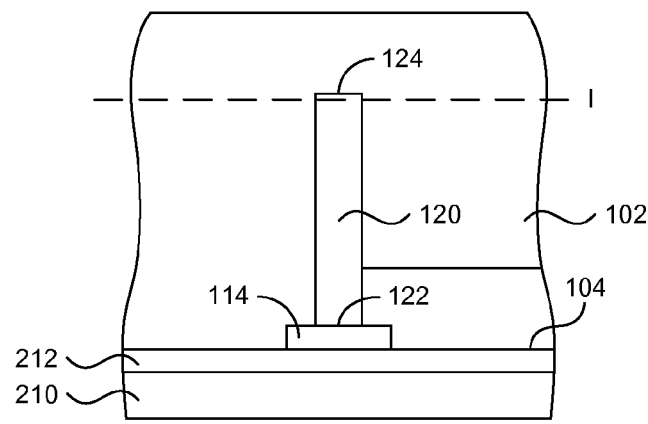
FIGS. 2A-2F are schematic cross-sectional views illustrating embodiments of stages of a method for fabricating semiconductor devices.

FIGS. 2A-2F illustrate stages of forming a portion of one of the semiconductor dies 110 noted by the dotted lines in FIG. 1. Referring to FIG. 2A, the substrate 102 is mounted to a carrier film 210 by an adhesive 212 at the first surface 104. The substrate 102 is at a full thickness at this stage, and the conductive feature 120 has been formed in a blind hole such that the second end 124 of the conductive feature 120 is at an intermediate elevation I within the substrate 102. Suitable methods for forming the conductive feature 120 are disclosed in U.S. patent application Ser. Nos. 10/925,501; 11/056,211; 11/217,877; and 11/215,214, all of which are incorporated by reference herein in their entirety.

Figure 2B:
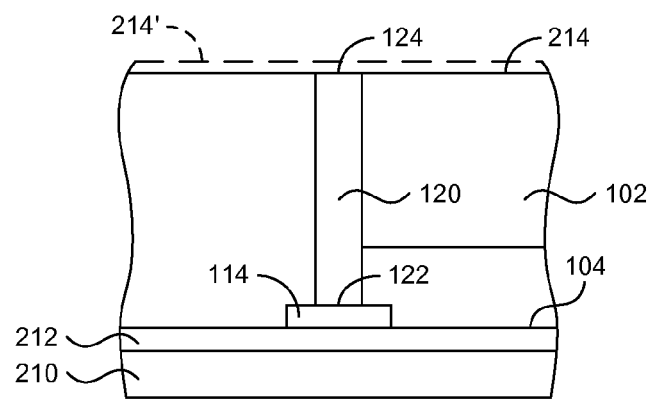

FIG. 2B illustrates a stage after the substrate 102 has been thinned from the full thickness illustrated in FIG. 2A to at least the intermediate elevation I (FIG. 2A) to form a thinned surface 214 at which the second end 124 of the conductive feature 120 is exposed or very nearly exposed. In the embodiment illustrated in FIG. 2B, the substrate 102 has been thinned to the extent that the second end 124 of the conductive feature 120 is exposed at the thinned surface 214. In other embodiments, however, the substrate 102 can be thinned to a thinned surface 214' (shown in dashed lines) spaced apart from the second end 124 of the conductive feature 120 by a small distance such that the second end 124 is not exposed at this stage. The substrate 102 can be thinned using back-grinding, chemical-mechanical planarizing, or other suitable techniques for efficiently and accurately removing material from the substrate 102.

Figure 2C:
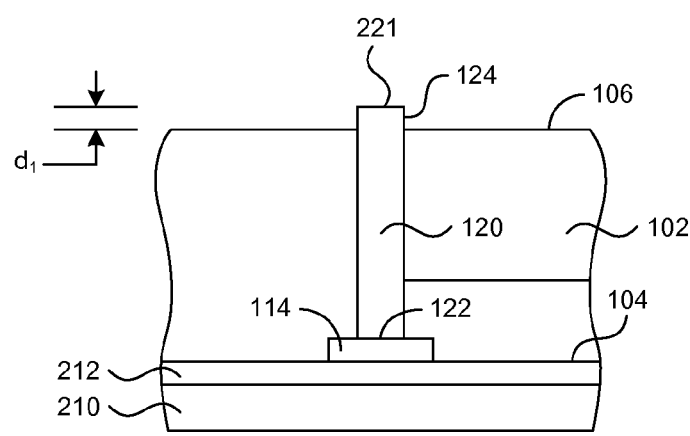

FIG. 2C illustrates a subsequent stage in which material has been removed from the thinned surface 214 illustrated in FIG. 2B to form the second surface 106 of the substrate at an elevation that is spaced apart from the second end 124 of the conductive feature 120. For example, a tip 221 of the second end 124 can be spaced apart or otherwise offset from the second surface 106 by the offset distance O explained above with respect to FIG. 1. The material can be removed from the thinned surface 214 illustrated in FIG. 2B to form the second surface 106 of the substrate 102 shown in FIG. 2C by etching or otherwise removing material from the substrate 102 without removing as much material from the second end 124 of the conductive feature 120. Suitable processes for selectively etching silicon or other semiconductor materials are known in the art.

Figure 2D:
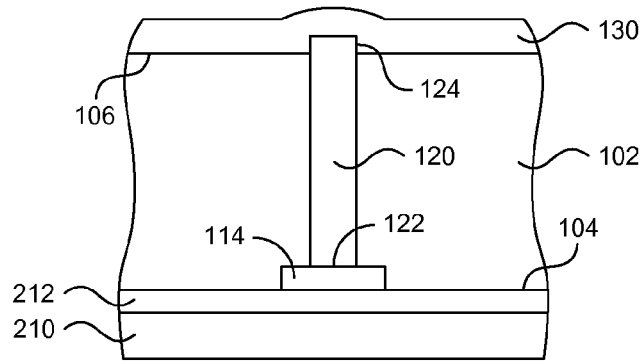
Figure 2E:
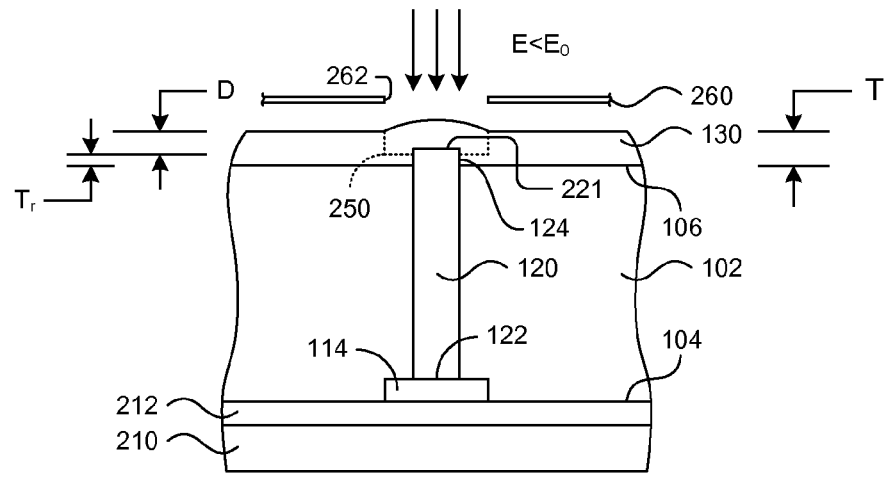
Figure 2F:
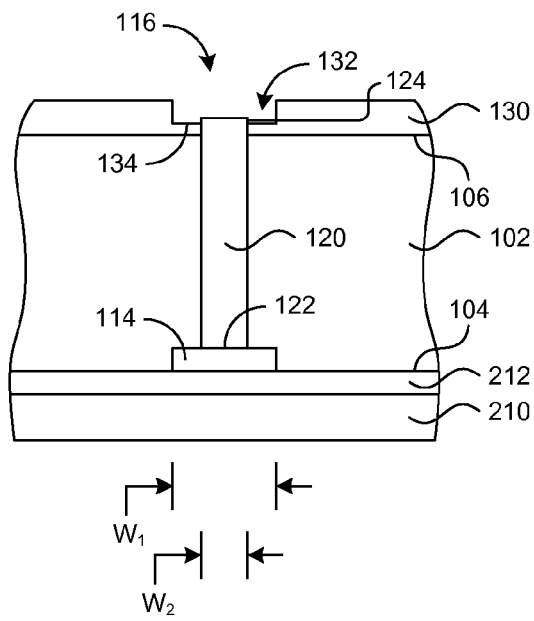

FIGS. 2D-2F illustrate additional stages of methods for fabricating semiconductor devices. FIG. 2D illustrates a stage after a dielectric material has been deposited onto the second surface 106 of the substrate 102 to form the dielectric layer 130. The dielectric material can be deposited using spin-on, electrochemical deposition (e.g., electrophoretic resists), or other suitable techniques for depositing the dielectric material onto the second surface 106. The dielectric layer 130 also covers the second end 124 of the conductive feature 120. The dielectric material of the dielectric layer 130 can be a photo-imageable polymer or other suitable dielectric material for protecting the second surface 106 of the substrate 102.

FIG. 2E illustrates a subsequent stage including irradiating areas of the dielectric layer 130 at the second ends 124 of the conductive features 120 to form photo-reacted material 250 (illustrated in dotted lines) in the dielectric layer 130. The photo-reacted material 250 shown in FIG. 2E extends to at least approximately the depth D in the dielectric layer 130. As a result, the dielectric layer 130 has a remaining thickness $T_r$ between the second surface 106 and the photo-reacted material 250. The photo-reacted material 250 can be formed by positioning a mask 260 relative to the substrate 102 such that openings 262 in the mask 260 are at least generally aligned with the second ends 124 of corresponding conductive features 120. After positioning the mask 260, the portions of the dielectric layer 130 aligned with the openings 262 are irradiated at an energy level E less than the minimum energy level $E_0$ required for the radiation to photo-chemically react the dielectric material through the full thickness T of the dielectric layer 130. By irradiating areas of the dielectric layer 130 at the second ends 124 of the conductive features 120 at the energy level E, the photo-reacted material 250 extends to only the intermediate depth D within the dielectric layer 130 instead of the full thickness T of the dielectric layer 130. The relative dosage level for exposing or otherwise irradiating the dielectric material can be selected according to several parameters. The energy level E, for example, can be the lowest amount of energy that forms a photo-reacted region with sufficient depth to be at or below the tip 221 of the second end 124 of the conductive feature 120. In one embodiment, the energy level E can be approximately 20-50% of $E_0$. In other embodiments, the energy level E can be less than approximately 80% of the energy $E_0$, less than approximately 50% of $E_0$, or 10% to 80% of $E_0$.

FIG. 2F illustrates a stage in which one of the depressions 132 is formed in the dielectric layer 130 by removing the photo-reacted material 250 (FIG. 2E) from the dielectric layer 130. The depression 132 can be formed by developing the photo-reacted region of the dielectric layer 130 with a suitable solution that dissolves the photo-reacted region selectively relative to the unreacted portions of the dielectric layer 130 and the material of the conductive feature 120. The depression 132 exposes at least a portion of the second end 124 of the conductive feature 120 without exposing the second surface 106 of the substrate 102. For example, the floor or bottom surface 134 of the depression 132 can be spaced apart from the second surface 106 of the substrate 102 by approximately the remaining thickness $T_r$ (FIG. 2E) of the dielectric layer 130 such that the remaining thickness of the dielectric layer covers the surface of the substrate adjacent to the second end 124 of the conductive feature 120. The depression 132 and the second end 124 of the conductive feature 120 accordingly define the second external contact site 116 associated with this conductive feature 120.

In the particular embodiment illustrated in FIG. 2F, the depression 132 has a cross-sectional dimension $W_1$ greater than a cross-sectional dimension $W_2$ of the conductive feature 120. The depression 132 can have other cross-sectional dimensions that are equal to or less than the cross-sectional dimension $W_2$ of the conductive feature 120. The ability to use a larger cross-sectional dimension for the depression 132 compared to the cross-sectional dimension of the conductive feature 120 makes it easier to align the openings in the mask 260 (FIG. 2E) with the conductive features 120. After forming the depressions 132, the carrier film 210 and adhesive 212 can be removed from the first surface 104, and then solder balls, wire bonds, or other types of connectors can be attached to the first and second external contact sites 114 and 116.

Several embodiments described above with respect to FIGS. 2A-2F can cost-effectively form stackable dies and inhibit metal shorting to the substrate. For example, because the depressions 132 can be larger than the second ends 124 of the conductive features 120, the alignment tolerance between the openings 262 in the mask 260 (FIG. 2E) and the conductive features 120 can be relatively large to mitigate alignment concerns. Additionally, because the depressions 132 do not expose the second surface 106 of the substrate 102, the second external contact sites 116 eliminate the possibility of shorting between the substrate 102 and solder balls or other conductive connectors attached to the second ends 124 of the conductive features 120.

Figure 3A:
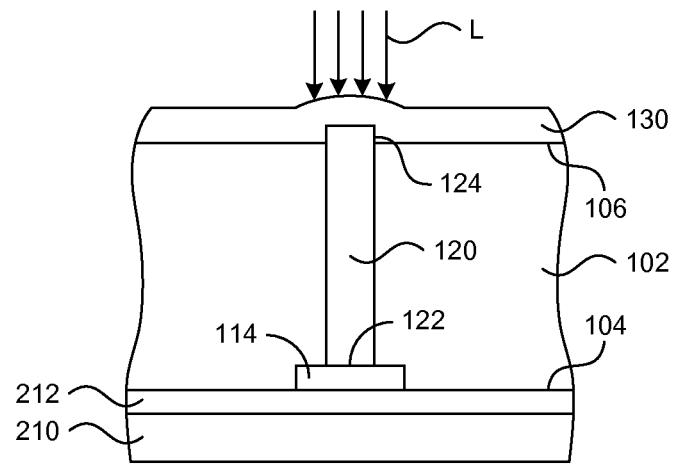
FIGS. 3A and 3B are schematic cross-sectional views illustrating stages of an embodiment of another method for fabricating semiconductor devices.
Figure 3B:
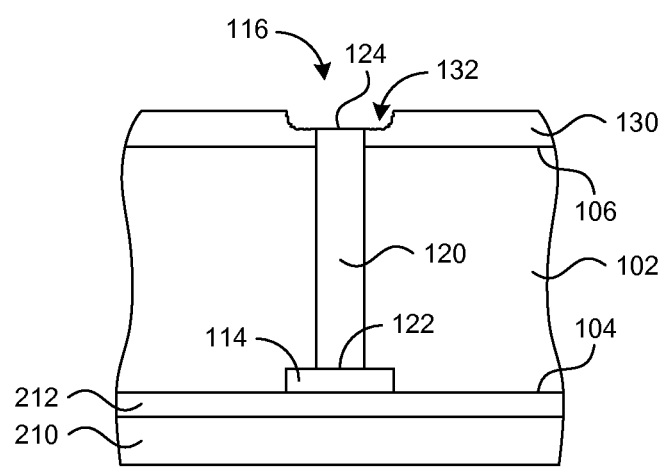

FIGS. 3A and 3B illustrate stages of another method for forming a semiconductor device. Like reference numbers refer to like components in FIGS. 1-3B. FIG. 3A, more specifically, illustrates a stage similar to the stages illustrated in FIGS. 2D and 2E explained above. In FIG. 3A, however, the dielectric layer 130 is irradiated at the second end 124 of the conductive feature 120 using a laser L instead of a microlithography process. The laser L ablates or otherwise removes the portion of the dielectric layer 130 covering the second end 124 of the conductive feature 120. The dielectric layer 130 in this embodiment, therefore, does not need to be a photo-imageable polymer or other type of a photo-imageable material. The dielectric layer 130 can instead be any suitable material that can be removed using a suitable laser. FIG. 3B illustrates a stage after which the laser L has formed a depression 132 in the dielectric layer 130 to expose at least a portion of the second end 124 of the conductive feature 120. The exposed portion of the second end 124 in the depression 132 accordingly defines one of the second external contact sites 116.

Figure 4A:
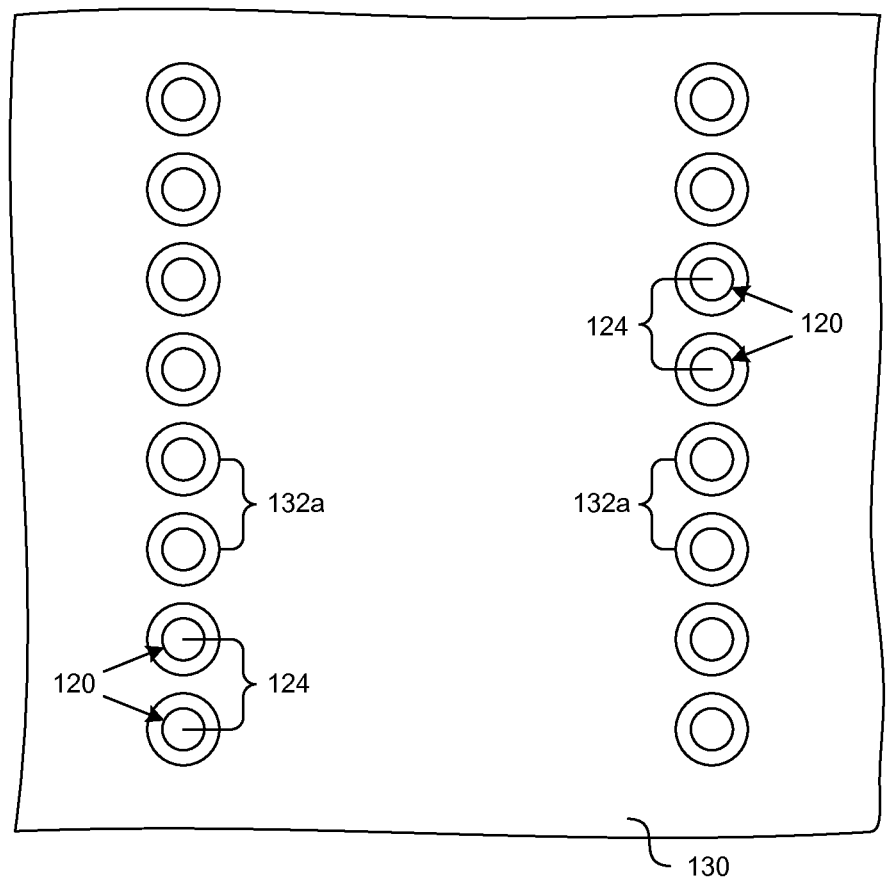
FIGS. 4A-4C are top plan views of different embodiments of semiconductor devices.
Figure 4B:
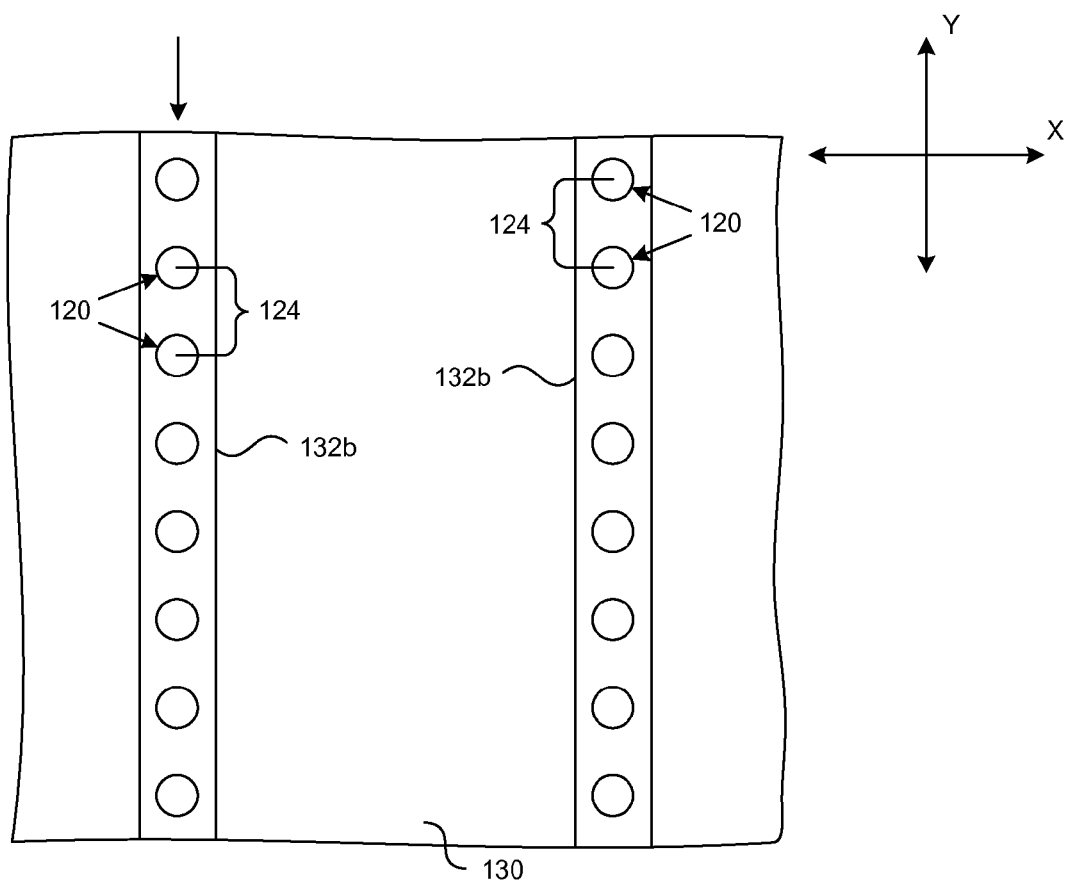
Figure 4C:
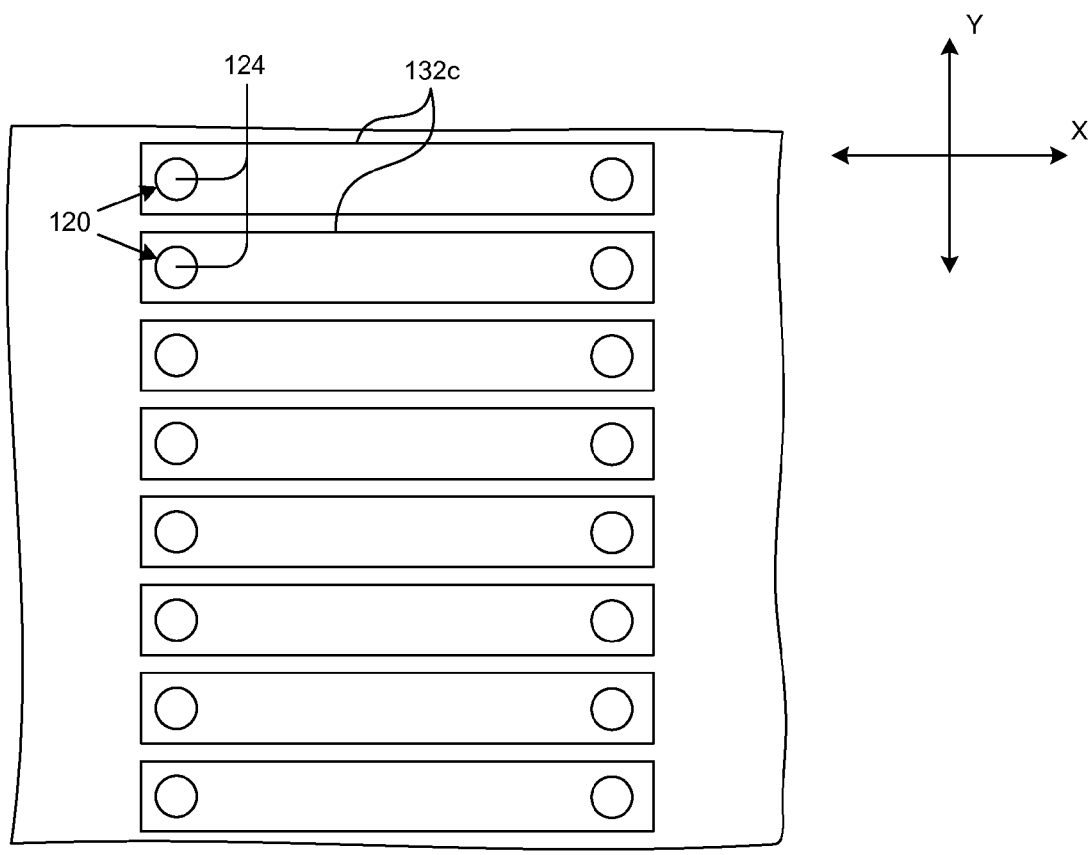

FIGS. 4A-4C illustrate various types of depressions formed relative to the second ends 124 of the conductive features 120, and like reference numbers refer to like components in FIGS. 4A-4C. FIG. 4A, more specifically, illustrates an embodiment in which discrete depressions 132a are formed at corresponding conductive members 120. For example, only a single second end 124 of a single conductive member 120 is exposed in a single one of the depressions 132a. The depressions 132a can be circular, rectilinear, or any other suitable shape to expose the individual conductive members 120. FIG. 4B illustrates an alternative embodiment in which individual depressions 132b expose a plurality of second ends 124 of separate conductive features 120. The depressions 132b, for example, can be long trenches aligned with the second ends 124 of a plurality of conductive features 120 along one direction Y relative to the wafer. FIG. 4C illustrates another embodiment in which the individual depressions 132c extend along a direction X of the wafer relative to the depressions 132b illustrated in FIG. 4B.

Figure 5:
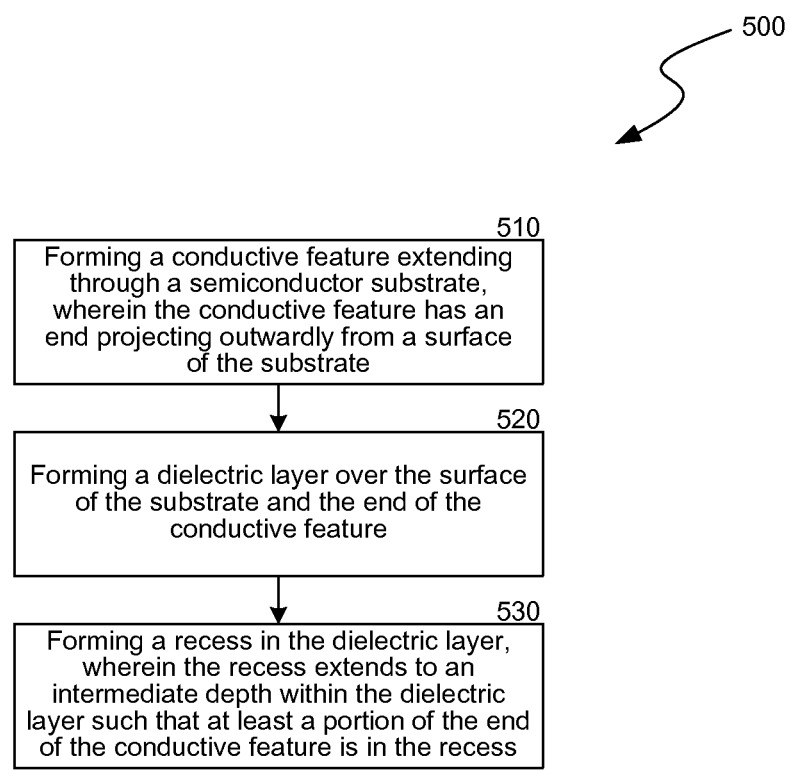
FIG. 5 is a flow chart illustrating an embodiment of a method for fabricating semiconductor devices.

FIG. 5 is a flow chart illustrating an embodiment of a method 500 for fabricating a semiconductor device. The method 500 can include forming a conductive feature extending through a semiconductor substrate such that the conductive feature has an end projecting outwardly from a surface of the substrate (block 510). The method 500 can further include forming a dielectric layer over the surface of the substrate and the end of the conductive feature (block 520) and forming a recess (e.g., a depression) in the dielectric layer (block 530). The recess, for example, can extend to an intermediate depth within the dielectric layer such that at least a portion of the end of the conductive feature is in the recess.

Figure 6:
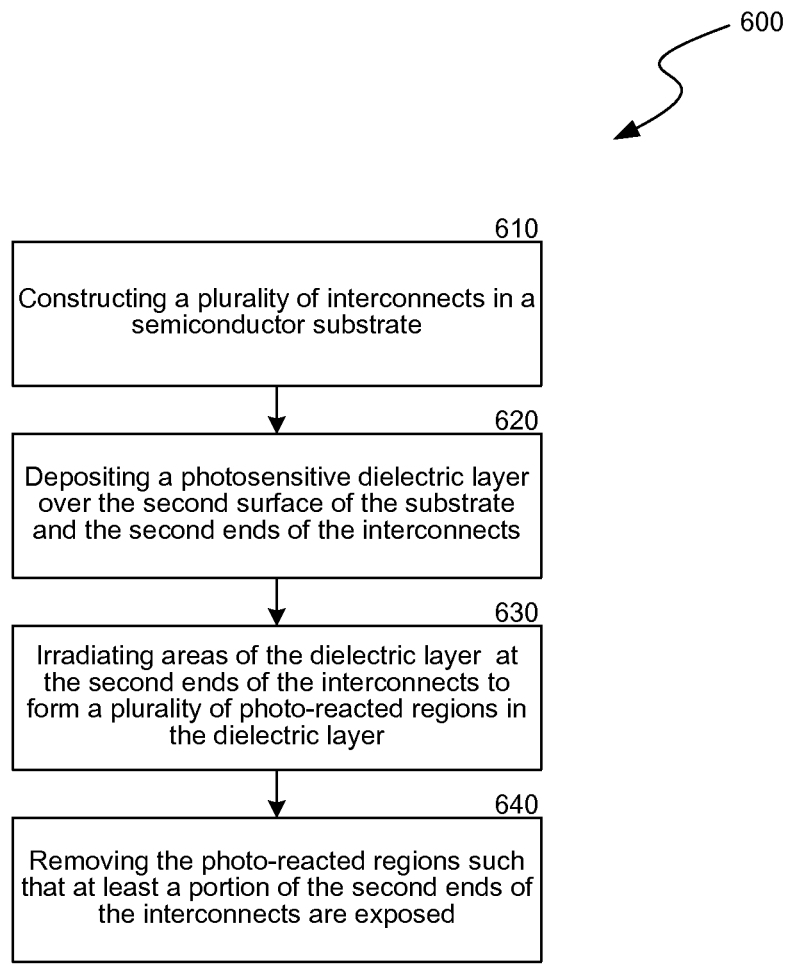
FIG. 6 is a flow chart illustrating another embodiment of a method for fabricating semiconductor devices.

FIG. 6 is a flow chart of an embodiment of another method 600 for fabricating a semiconductor device. The method 600 can include constructing a plurality of conductive features, such as interconnects in a semiconductor substrate (block 610). The interconnects can be constructed such that individual interconnects have a first end electrically coupled to a bond site at a first surface of a substrate and a second end projecting away from a second surface of the substrate. For example, the second end of the interconnect can project away from the second surface of the substrate such that a tip of the second end of the interconnect is non-planar relative to the second surface of the substrate (e.g., offset from the second surface 106). The method 600 can further include depositing a photosensitive or otherwise photo-reactive dielectric layer over the second surface of the substrate and the second ends of the interconnects (block 620). The method can also include irradiating areas of the dielectric layer at the second ends of the interconnects to form a plurality of photo-reacted regions in the dielectric layer (block 630) and removing the photo-reacted regions such that at least a portion of the second ends of the interconnects are exposed (block 640). The process of irradiating areas of the dielectric layer can include forming the photo-reacted regions such that the photo-reacted regions extend to a depth in the dielectric layer less than the thickness of the dielectric layer.

Figure 7:
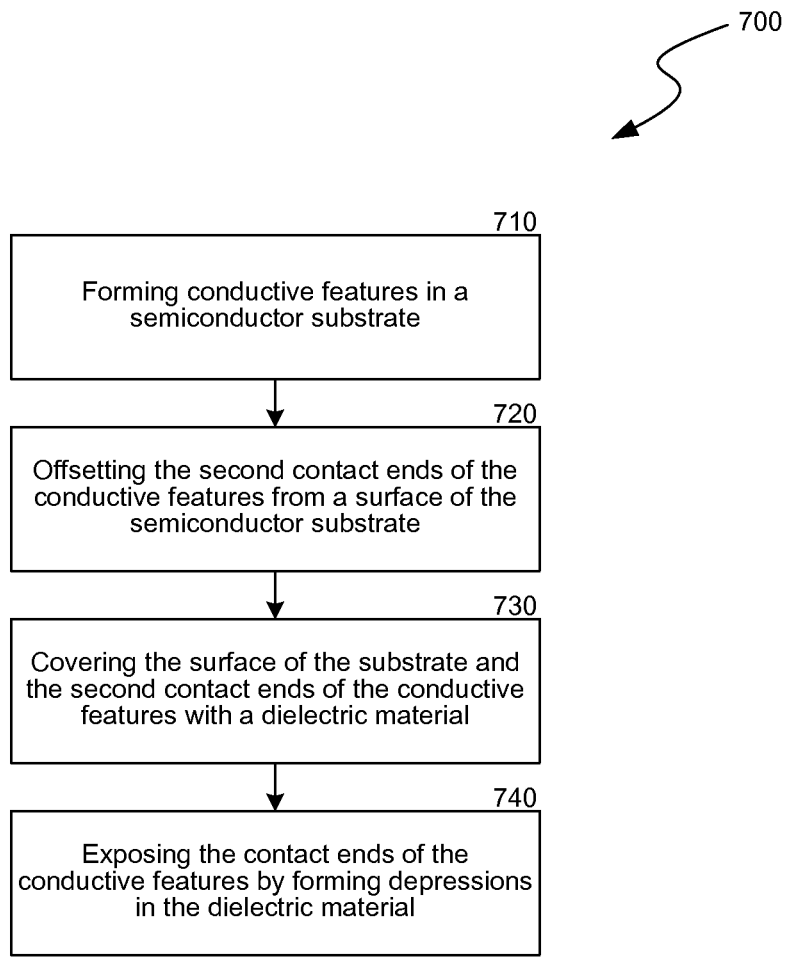
FIG. 7 is a flow chart illustrating another embodiment of a method for fabricating semiconductor devices.

FIG. 7 is a flow chart of an embodiment of another method 700 for fabricating a semiconductor device. The method 700 can include forming conductive features in a semiconductor substrate (block 710) such that the conductive features have first contact ends at bond sites and second contact ends spaced apart from the first contact ends. The method 700 can further include offsetting the second contact ends of the conductive features from a surface of the semiconductor substrate (block 720) and covering the surface of the substrate and the second contact ends of the conductive features with a dielectric material (block 730). The method 700 can also include exposing the contact ends of the conductive features by forming depressions in the dielectric material (block 740). For example, the depressions can be formed to be at least as large as the second contact ends without exposing the surface of the substrate through the depressions.

Figure 8:
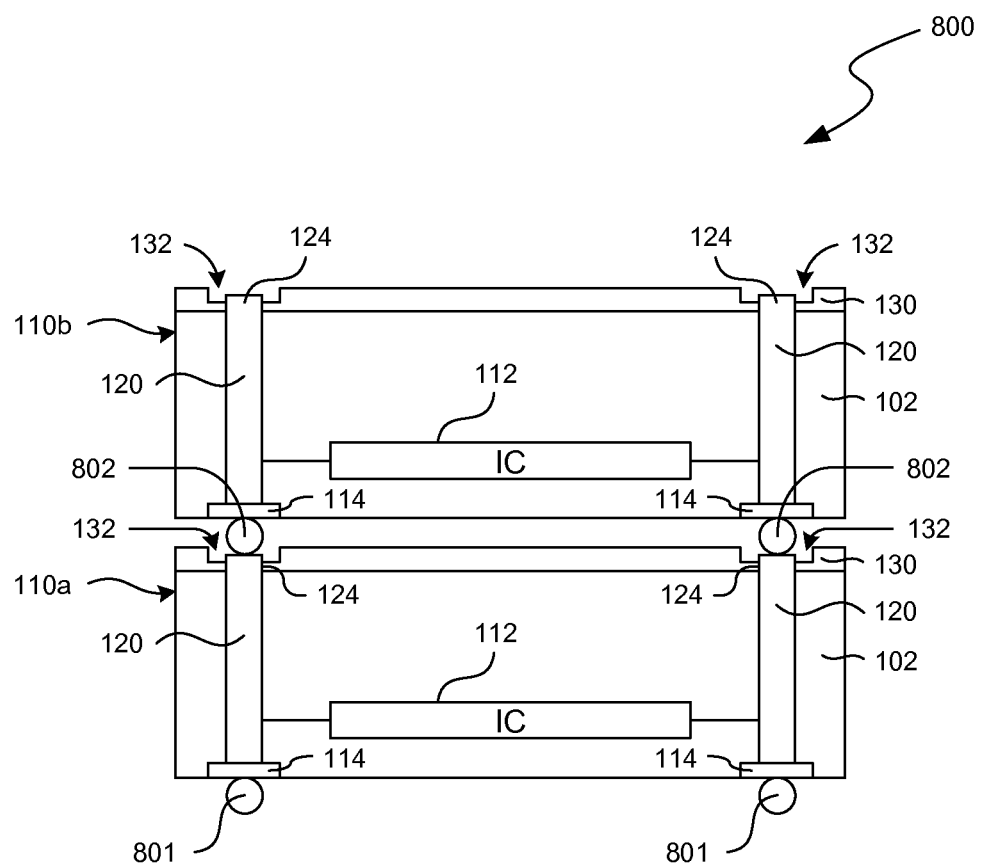
FIG. 8 is a schematic cross-sectional view illustrating an embodiment of a stacked-die assembly.

FIG. 8 is a schematic cross-sectional view of a stacked-die assembly 800 having a first semiconductor die 110a and a second semiconductor device 110b stacked on the first semiconductor die 110a. The first and second semiconductor dies 110a-b can be similar to the semiconductor dies 110 described above with respect to FIG. 1, and therefore like reference numbers refer to like components in FIGS. 1 and 8. The stacked-die assembly 800 can be formed by depositing first connectors 801 onto the first external contact sites 114 of the first semiconductor die 110a and disposing second connectors 802 between the second ends 124 of the conductive features 120 of the first semiconductor die 110a and the first external contact sites 114 of the second semiconductor die 110b. The second connectors 802 can be solder balls or other types of electrical links that are deposited or otherwise formed on either the second ends 124 of the conductive features 120 of the first semiconductor die 110a or the first external contact sites 114 of the second semiconductor die 110b. The first and second semiconductor dies 110a-b are then aligned and positioned so that the second connectors 802 electrically couple the conductive features 120 of the first semiconductor die 110a with corresponding conductive features 120 of the second semiconductor die 110b.

Figure 9A:
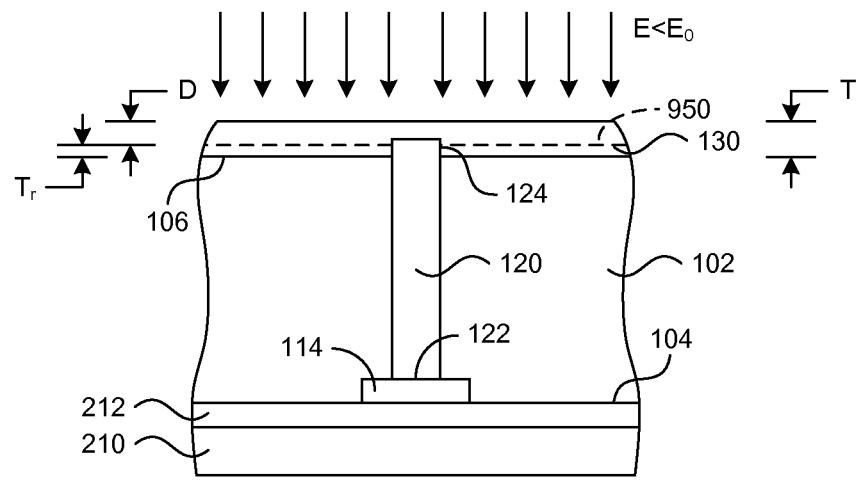
FIGS. 9A and 9B are schematic cross-sectional views illustrating stages of an embodiment of another method for fabricating semiconductor devices.
Figure 9B:
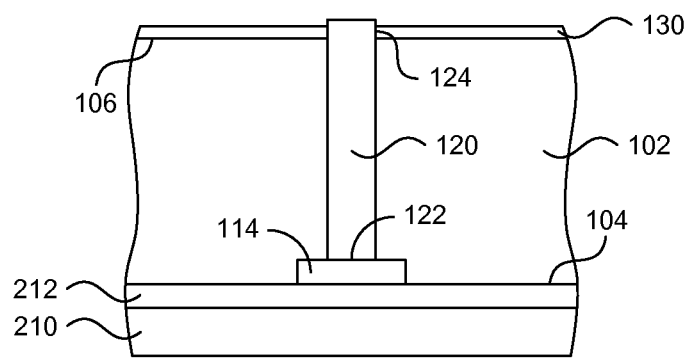
Figure 10:
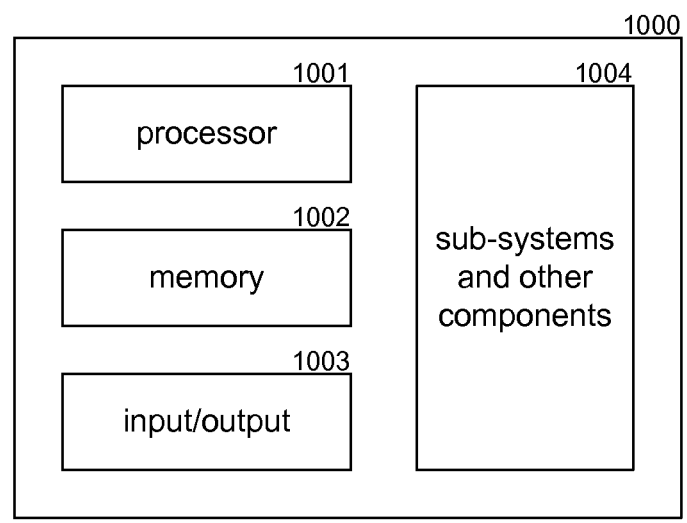
FIG. 10 is a schematic illustration of a system including semiconductor devices.

FIGS. 9A and 9B are schematic cross-sectional views of stages of another embodiment for fabricating semiconductor devices, and like reference numbers refer to like components and procedures in FIGS. 1-9B. FIG. 9A illustrates globally irradiating the dielectric layer 130 at an energy level E less than the energy level $E_0$ using a lamp to form a stratum of photo-reacted material 950 (illustrated in dotted lines) at an intermediate depth completely across the dielectric layer 130. The photo-reacted material 950 shown in FIG. 9A is similar to the photo-reacted region shown in FIG. 2E, and thus the photo-reacted material 950 extends to at least approximately the depth D in the dielectric layer 130. As a result, the dielectric layer 130 has a remaining thickness $T_r$ between the second surface 106 and the photo-reacted material 950. The irradiation procedure in FIG. 9A, however, is a global flood exposure procedure that exposes large areas and even the full surface area of the dielectric layer 130 without using a mask or micro-lithography equipment. Suitable systems for exposing the dielectric layer 130 include ultraviolet lamps, such as the UVEX UV tool, as an alternative to stepper or scanner tools used in micro-lithography processes. The relative dosage level for exposing or otherwise irradiating the dielectric material can be selected according to several parameters. The applied energy level E, for example, can be the lowest amount of energy that forms the photo-reacted region with sufficient depth to be at or below the tip 221 of the second end 124 of the conductive feature 120. As noted above, the energy level E can be approximately 20-50% of $E_0$, but in other embodiments the energy level E can be less than approximately 80% of the energy level $E_0$, less than approximately 50% of $E_0$, or 10% to 80% of $E_0$.

FIG. 9B illustrates a subsequent stage in which the stratum of photo-reacted material 950 has been stripped or otherwise removed completely across the substrate to expose the second ends 124 of the conductive features 120. The photo-reacted material 950 can be removed by developing the photo-reacted material 950 to clear the portion of the dielectric layer 130 above the second ends 124. The remaining thickness of the dielectric layer accordingly covers the second side of the surface of the substrate adjacent to the second ends of the conductive features 120 and across other regions of the substrate surface. In this embodiment, the second ends 124 define the external contact sites at the second side or back side of the wafer. After forming the external contact sites, solder balls or other electrical connectors can be formed at the second ends 124 of the conductive features 120.

The embodiment of the method shown in FIGS. 9A and 9B provides a fast, low-cost process for forming external contact sites at through-substrate interconnects or other types of interconnects. For example, several examples of the method shown in FIGS. 9A and 9B use a flood lamp instead of micro-lithography equipment to increase the number of wafers that can be processed per hour and reduce the use of expensive micro-lithography equipment.

Any one of the semiconductor components described above with reference to FIGS. 1-10 can be incorporated into any of a myriad of larger and/or more complex systems, a representative example of which is system 1000 shown schematically in FIG. 10. The system 1000 can include a processor 1001, a memory 1002 (e.g., SRAM, DRAM, flash, and/or other memory device), input/output devices 1003, and/or other subsystems or components 1004. The foregoing semiconductor components described above with reference to FIGS. 1A-6 may be included in any of the components shown in FIG. 10. The resulting system 1000 can perform any of a wide variety of computing, processing, storage, sensing, imaging, and/or other functions. Accordingly, representative systems 1000 include, without limitation, computers and/or other data processors, for example, desktop computers, laptop computers, Internet appliances, hand-held devices (e.g., palm-top computers, wearable computers, cellular or mobile phones, personal digital assistants, etc.), multi-processor systems, processor-based or programmable consumer electronics, network computers, and minicomputers. Other representative systems 1000 include cameras, light or other radiation sensors, servers and associated server subsystems, display devices, and/or memory devices. In such systems, individual dies can include imager arrays, such as CMOS imagers. Components of the system 1000 may be housed in a single unit or distributed over multiple, interconnected units (e.g., through a communications network). The components of the system 1000 can accordingly include local and/or remote memory storage devices and any of a wide variety of computer-readable media.

From the foregoing, it will be appreciated that specific embodiments have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. It will also be appreciated that specific embodiments have been described herein for purposes of illustration, but that various modifications may be made without deviating from the inventions. For example, many of the elements of one embodiment can be combined with other embodiments in addition to, or in lieu of, the elements of the other embodiments. Accordingly, the disclosure can include other embodiments not shown or described above.

I claim:

1. A semiconductor device, comprising:
   a semiconductor substrate having an integrated circuit, a first surface, and a second surface opposite the first surface;
   a plurality of through-substrate interconnects electrically coupled to the integrated circuit, wherein individual interconnects have—
   a first end at least proximate to the first surface of the substrate; and
   a second end having a tip projecting from the second surface of the substrate such that the tip is spaced apart from the second surface of the substrate by an offset distance; and
   a dielectric layer at the second surface of the substrate, wherein the dielectric layer covers the second surface of the substrate and includes an outer surface,
   wherein each interconnect includes a sidewall surface that extends at least partially through the substrate and the dielectric layer, and wherein the interconnect further includes a contact surface that is below the outer surface of the dielectric layer and generally transverse to the sidewall surface, and spaced apart from the dielectric layer by a void between a portion of the sidewall surface and the dielectric layer, and further wherein the contact surface and the portion of the sidewall surface are both exposed.

2. The device of claim 1 wherein the dielectric layer has a constant thickness across the second surface of the substrate and the second ends of the interconnects project beyond the dielectric layer.

3. The device of claim 1 wherein the dielectric layer has a plurality of depressions with bottom surfaces at an intermediate depth in the dielectric layer such that the bottom surfaces are spaced apart from the second surface of the substrate, and wherein the second ends of the interconnects are exposed at corresponding recesses.

4. The device of claim 1 wherein the dielectric layer comprises a photosensitive polymeric material.

5. The system of claim 1 wherein the dielectric layer is homogenous.

6. A semiconductor device, comprising:
   a semiconductor substrate having a front side, a back side opposite the front side, and a plurality of bond sites at the front side;
   a dielectric layer at the back side of the substrate, wherein the dielectric layer has an outer surface, a thickness and a plurality of depressions that extend to an intermediate depth through a portion of the thickness of the dielectric layer such that a remaining thickness of the dielectric layer remains on the back side of the substrate at the depressions; and
   interconnects extending through the substrate from the bond sites at the front side to the depressions at the back side, wherein the individual interconnects are recessed beneath the outer surface of the dielectric layer and include a sidewall, and wherein the sidewall—
   extends through the substrate, and
   includes a portion that is exposed at the back side and spaced apart from the dielectric layer by a void directly between the dielectric layer and the portion of the sidewall.

7. A system, comprising:
   a semiconductor component including—
   a semiconductor substrate having a front side, a back side opposite the front side, and a plurality of bond sites at the front side;
   a dielectric layer at the back side of the substrate, wherein the dielectric layer has an outer surface and a depth, and a plurality of depressions that extend through only a portion of the depth of the dielectric layer such that a portion of the dielectric layer remains on the back side of the substrate at the depressions, wherein the individual depressions include a sidewall that is generally transverse to the outer surface; and
   interconnects extending through the substrate from the bond sites at the front side to the depressions at the back side, wherein the individual interconnects include a portion that is exposed at a first side and a second side and recessed below the outer surface, and wherein the second side is—
   generally transverse to the first side, spaced apart from the sidewall of the individual depressions by a void, and facing the sidewall of the individual depressions across the void.

8. A semiconductor device, comprising:
   a semiconductor substrate having a front side, a back side opposite the front side, and a plurality of bond sites at the front side;
   a dielectric material at the back side of the substrate, wherein the dielectric material is homogenous, has an outer surface, and has a thickness and a plurality of depressions that extend to an intermediate depth through a portion of the thickness of the dielectric material such that a remaining thickness of the dielectric material remains on the back side of the substrate at the depressions; and
   interconnects extending through the substrate from the bond sites at the front side to the depressions at the back side, wherein individual interconnects include a homogenous conductive material extending through both the substrate and the dielectric material, but recessed within the individual depressions and beneath the outer surface.

9. The device of claim 8 wherein the dielectric material comprises a photosensitive polymeric material.

10. The device of claim 8 wherein the conductive material includes a first sidewall extending through both the substrate and the dielectric material, and wherein the dielectric material includes a second sidewall and a third sidewall offset from the second sidewall, wherein the second sidewall is spaced apart from the first sidewall of the conductive material, and wherein the third sidewall interfaces with the first sidewall of the conductive material.

11. The device of claim 8 wherein the remaining thickness defines a floor within the individual depressions, and wherein the individual interconnects do not extend beyond the floor.

* * * * *

UNITED STATES PATENT AND TRADEMARK OFFICE
CERTIFICATE OF CORRECTION

| | |
|---|---|
| PATENT NO. | : 9,054,165 B2 |
| APPLICATION NO. | : 13/468655 |
| DATED | : June 9, 2015 |
| INVENTOR(S) | : David S. Pratt |

It is certified that error appears in the above-identified patent and that said Letters Patent is hereby corrected as shown below:

In the Claims

In column 10, line 52, in claim 10, delete "sidewa11" and insert -- sidewall --, therefor.

Signed and Sealed this
Eighth Day of December, 2015

Michelle K. Lee
*Director of the United States Patent and Trademark Office*